US009741411B2

(12) United States Patent
Lee

(10) Patent No.: US 9,741,411 B2
(45) Date of Patent: Aug. 22, 2017

(54) BANK CONTROL CIRCUIT AND SEMICONDUCTOR MEMORY DEVICE FOR DATA ACCESS WITH LIMITED BANDWIDTH FOR COMMANDS

(71) Applicant: SK hynix Inc., Gyeonggi-do (KR)

(72) Inventor: Hyun-Sung Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/572,189

(22) Filed: Dec. 16, 2014

(65) Prior Publication Data

US 2016/0035400 A1 Feb. 4, 2016

(30) Foreign Application Priority Data

Aug. 4, 2014 (KR) ........................ 10-2014-0099636

(51) Int. Cl.
*G11C 8/00* (2006.01)
*G11C 8/18* (2006.01)
*G11C 8/10* (2006.01)
*G11C 8/12* (2006.01)
*G11C 7/10* (2006.01)
*G11C 7/12* (2006.01)
*G11C 7/22* (2006.01)

(52) U.S. Cl.
CPC ............... *G11C 8/18* (2013.01); *G11C 7/109* (2013.01); *G11C 7/12* (2013.01); *G11C 7/222* (2013.01); *G11C 8/10* (2013.01); *G11C 8/12* (2013.01)

(58) Field of Classification Search
None
See application file for complete search history.

(56) References Cited

U.S. PATENT DOCUMENTS

| 7,057,950 | B2* | 6/2006 | Lee ........................ | G11C 7/12 365/203 |
| 2002/0110037 | A1* | 8/2002 | Fukuyama ........... | G11C 7/1021 365/230.03 |
| 2010/0271892 | A1* | 10/2010 | Chu ........................ | G11C 7/12 365/203 |
| 2012/0106277 | A1* | 5/2012 | Kwean .............. | G11C 11/40622 365/194 |
| 2015/0009768 | A1* | 1/2015 | Jang .................... | G11C 11/4076 365/194 |
| 2015/0043297 | A1* | 2/2015 | Hong ..................... | G11C 8/18 365/230.03 |
| 2015/0049570 | A1* | 2/2015 | Lee ........................ | G11C 8/08 365/230.03 |
| 2015/0279443 | A1* | 10/2015 | Park .................... | G11C 11/4076 365/189.05 |

FOREIGN PATENT DOCUMENTS

KR 100911199 8/2009

* cited by examiner

*Primary Examiner* — Harry W Byrne
*Assistant Examiner* — Sultana Begum
(74) *Attorney, Agent, or Firm* — IP & T Group LLP

(57) ABSTRACT

A bank control circuit includes an implicit signal generation unit suitable for activating an implicit signal when a first active signal corresponding to a bank which is in an activated state bank, among a plurality of banks; and a delay unit suitable for delaying the implicit signal by a predetermined time, wherein the bank corresponding to the first active signal is precharged based on the implicit signal and activated again based on the delayed implicit signal.

12 Claims, 5 Drawing Sheets

BANK CONTROL CIRCUIT AND SEMICONDUCTOR MEMORY DEVICE FOR DATA ACCESS WITH LIMITED BANDWIDTH FOR COMMANDS

CROSS-REFERENCE TO RELATED APPLICATIONS

The present application claims priority of Korean Patent Application No. 10-2014-0099636, filed on Aug. 4, 2014, which is incorporated herein by reference in its entirety.

BACKGROUND

1. Field

Various embodiments of the present invention relate to a semiconductor design technology, and more particularly, to a bank control circuit for controlling a bank operation, and a semiconductor memory device including the bank control circuit.

2. Description of the Related Art

In order to improve data processing performance, high bandwidth is required for semiconductor memory devices. The number of input/output lines of a semiconductor memory device is increased to have an improved data input/output rate and thus obtain the high bandwidth.

A semiconductor memory device receives an external command and performs an active operation for activating a row, for example, a word line, and a precharge operation for deactivating the row based on the external command. After the row is activated, the semiconductor memory device may perform a read operation or a write operation. When the active operation is performed, signals may remain in the signal lines, such as, data input/output lines and a bit line, that are used for performing a data input/output operation during the active operation. Accordingly, the signal lines have to be precharged into a predetermined level to prepare for the next read or write operation. To this end, the semiconductor memory device has to perform a precharge operation between active operations. Therefore, when another word line is activated in a bank that has performed an active operation, such as, a memory bank, a precharge command is received and a precharge operation is performed first, and then an active command is received again to perform an active operation. However, as the data input/output performance of a semiconductor memory device including a plurality of banks improves, the bandwidth for commands is relatively low, compared with the bandwidth of input/output data.

SUMMARY

Various embodiments of the present invention are directed to a semiconductor memory device that may perform data access with a limited bandwidth of commands.

Additionally, various embodiments of the present invention are directed to a semiconductor memory device that may support an implicit precharge operation.

In accordance with an embodiment of the present invention, a bank control circuit includes: an implicit signal generation unit suitable for activating an implicit signal when a first active signal corresponding to a bank which is in an activated state, among a plurality of banks; and a delay unit suitable for delaying the implicit signal by a predetermined time, wherein the bank corresponding to the first active signal is precharged based on the implicit signal and activated again based on the delayed implicit signal.

The bank control circuit may further include: an active operation signal output unit suitable for generating an active operation signal for the bank based on the first active signal or a second active signal that is obtained by delaying the implicit signal by the predetermined time according to the implicit signal; and an address transmission unit suitable for outputting an address, which is inputted along with the first active signal based on the implicit signal.

The address transmission unit temporarily stores the address based on the implicit signal, and outputs the stored address according to the second active signal.

The predetermined time may correspond to a row precharge time.

The active operation signal output unit may active the active operation signal in response to the first active signal and the second active signal when the implicit signal is deactivated, and the active operation signal output unit deactivates the active operation signal when the implicit signal is activated.

In accordance with an embodiment of the present invention, a semiconductor memory device includes: a plurality of banks; a bank operation control unit suitable for receiving a first active signal and bank information, and activating a first active operation signal for an active operation of a bank corresponding to the bank information among the banks or activating an implicit signal for a precharge operation of the bank and a second active operation signal for an active operation of the bank after a predetermined time passes, based on whether or not a bank corresponding to the bank information is activated; an internal precharge signal generation unit suitable for generating an internal precharge signal based on a precharge signal or the implicit signal; and a bank activation unit suitable for activating a bank which is in a deactivated state among the banks, based on the first active operation signal, or deactivating a bank which is in an activated state among the banks, based on the internal precharge signal and then activating the deactivated bank based on the second active operation signal.

The bank operation control unit may activate the first active operation signal when the bank corresponding to the bank information is deactivated, and the bank operation control unit activates the second active operation signal after the predetermined time passes, and activates the implicit signal when the bank corresponding to the bank information is activated.

The bank activation unit may deactivate the bank activation signal based on the internal precharge signal, or activates the bank activation signal based on the first and second active operation signals.

The semiconductor memory device may further include: an interface unit suitable for receiving an external address and an external clock signal and outputting a command identification signal, a row address, and a bank address; and a command decoder suitable for decoding the command identification signal and outputting the first active signal.

The bank operation control unit may include: an implicit signal generation unit suitable for generating the implicit signal based on the bank activation signal of the bank corresponding to the bank information; a delay unit suitable for receiving the implicit signal and activating a second active signal after the predetermined time passes; an active operation signal output unit suitable for generating an active operation signal for the bank based on the first active signal or a second active signal that is obtained by delaying the implicit signal by the predetermined time according to the implicit signal; and an address transmission unit suitable for temporarily storing the row address and the bank address based on the implicit signal, and outputting the row address and the bank address based on the second active signal.

The semiconductor memory device may further include: a row address latch unit suitable for latching the row address transmitted from the interface unit or the address transmission unit based on the active operation signal; and a bank address decoder suitable for decoding the bank address transmitted from the interface unit or the address transmission unit, and generating a bank selection signal.

The bank information may include the bank selection signal.

The predetermined time may correspond to a row precharge time.

In accordance with embodiment of the present invention, a semiconductor memory device includes: a plurality of banks; a bank operation control unit suitable for receiving a first active signal and bank information, and activating a first active operation signal based on the first active signal and the bank information or activating an implicit signal for a precharge operation of a bank corresponding to the bank information among the banks based on the first active signal and the bank information and then activating a second active operation signal after a predetermined time passes based on whether or not the bank corresponding to the bank information is activated before the first active signal and the bank information are received; an internal precharge signal generation unit suitable for generating an internal precharge signal based on a precharge signal or the implicit signal; and a bank activation unit suitable for activating a bank activation signal based on the first active operation signal or the second active operation signal, and deactivating the bank activation signal based on the internal precharge signal.

The bank operation control unit may activate the first active operation signal when the bank corresponding to the bank information is deactivated, and the bank operation control unit activates the implicit signal and the second active operation signal when the bank corresponding to the bank information is activated.

The semiconductor memory device may further include: an interface unit suitable for receiving an external address and an external clock signal and outputting a command identification signal, a row address, and a bank address; and a command decoder suitable for decoding the command identification signal and outputting the first active signal and the precharge signal.

The bank operation control unit may include: an implicit signal generation unit suitable for generating the implicit signal based on the bank activation signal of the bank corresponding to the bank information; a delay unit suitable for receiving the implicit signal and activating the second active signal after the predetermined time passes; an active operation signal output unit suitable for generating an active operation signal for the bank based on the first active signal or a second active signal that is obtained by delaying the implicit signal by the predetermined time according to the implicit signal; and an address transmission unit suitable for temporarily storing the row address and the bank address based on the implicit signal, and outputting the row address and the bank address based on the second active signal.

The semiconductor memory device may further include: a row address latch unit suitable for latching the row address transmitted from the interface unit or the address transmission unit based on the active operation signal; and a bank address decoder suitable for decoding the bank address transmitted from the interface unit or the address transmission unit and generating a bank selection signal.

The predetermined time may correspond to a row precharge time.

DETAILED DESCRIPTION

Figure 1:
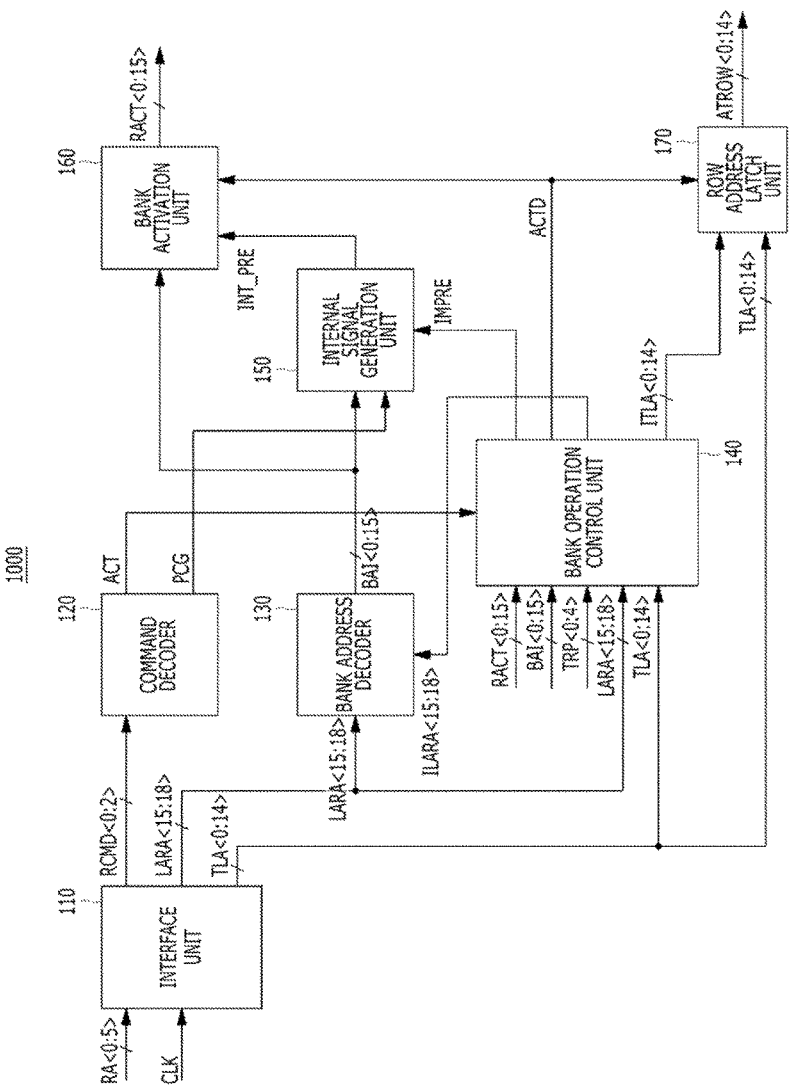
FIG. 1 is a block diagram illustrating a semiconductor memory device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to when the first layer is formed directly on the second layer or the substrate but also when a third layer exists between the first layer and the second layer or the substrate.

FIG. 1 is a block diagram illustrating a semiconductor memory device 1000 in accordance with an embodiment of the present invention.

Referring to FIG. 1, the semiconductor memory device 1000 may include an interface unit 110, a command decoder 120, a bank address decoder 130, a bank operation control unit 140, an internal precharge signal generation unit 150, a bank activation unit 160, and a row address latch unit 170.

The interface unit 110 may receive an external address RA<0:5> and a clock signal CLK from an external device. The Interface unit 110 latches the external address RA<0:5> and outputs a command identification signal RCMD<0:2> for identifying a command, a first bank address LARA<15:18>, and a first row address TLA<0:14>.

The command decoder 120 may decode the command identification signal RCMD<0:2> transmitted from the interface unit 110 and output diverse commands, which include a first active signal ACT and a precharge signal PCG.

The bank address decoder 130 may decode the first bank address LARA<15:18> outputted from the interface unit 110 and a second bank address ILARA<15:18> outputted from the bank operation control unit 140, and output a bank selection signal BAI<0:15>. The bank selection signal BAI<0:15> selects one bank to be activated among a first bank BANK0 to a $16^{th}$ bank BANK15.

The bank operation control unit 140 may receive the first active signal ACT from the command decoder 120, the bank selection signal BAI<0:15> from the bank address decoder 130, and a bank activation signal RACT<0:15> from the bank activation unit 160.

The bank activation signal RACT<0:15> may represent whether or not the bank corresponding to the bank selection signal BAI<0:15> is activated. The bank activation signal RACT<0:15> may be outputted from the bank activation unit 160. Additionally, the bank activation signal RACT<0:15> may be activated when the bank selected based on the bank selection signal BAI<0:15> performs an active operation, and deactivated when the bank selected based on the bank selection signal BAI<0:15> performs a precharge operation. The bank operation control unit 140 may receive the first active signal ACT and bank information, and output an active operation signal ACTD for performing the active operation of the bank or output an implicit signal IMPRE for performing the precharge operation of the bank and the active operation signal ACTD at an interval of a first delay time. The bank information may signify the bank selection signal BAI<0:15> that is transmitted from the bank address decoder 130. That is, the bank operation control unit 140 may output the activated active operation signal ACTD to the bank activator 160 and the row address latch 170 when the bank corresponding to the received bank selection signal BAI<0:15> is determined to be deactivated based on the bank activation signal RACT<0:15>. The bank operation control unit 140 may output the activated implicit signal IMPRE to the internal precharge signal generation unit 150 when the bank corresponding to the received bank selection signal BAI<0:15> is determined to be activated based on the bank activation signal RACT<0:15>, and after the first delay time passes, the bank operation control unit 140 may output the activated active operation signal ACTD to the bank activation unit 160 and the row address latch unit 170.

That is, the bank operation control unit 140 may determine whether the first active signal ACT outputted from the command decoder 120 represents a normal active operation or an active operation accompanying an implicit precharge operation based on the bank activation signal RACT<0:15> outputted from the bank activation unit 160 and the bank address decoder 130. When it is determined, based on the bank activation signal RACT<0:15>, that the bank corresponding to the bank selection signal BAI<0:15> is deactivated, the first active signal ACT outputted from the command decoder 120 may signify a command for a normal active operation. Therefore, the bank operation control unit 140 may activate the active operation signal ACTD. When it is determined based on the bank activation signal RACT<0:15> that the bank corresponding to the bank selection signal BAI<0:15> is activated, the first active signal ACT may be an active command corresponding to the currently activated bank, and represents a command for performing an implicit precharge operation and a subsequent active operation. Therefore, the bank operation control unit 140 may activate the implicit signal IMPRE, and activate the active operation signal ACTD for performing an active operation after the first delay time passes.

The implicit precharge operation is a precharge operation that is performed not based on a precharge command but based on an active command for activating another word line included in the currently activated bank. According to the embodiment of the present invention, to activate a word line corresponding to a new row address, which is included in the currently activated bank, a precharge operation and an active operation may be performed on the word line based on an active command, and the implicit precharge operation is a precharge operation that is performed based on the one active signal.

The implicit signal IMPRE may be a signal for precharging a bank corresponding to the bank selection signal BAI<0:15>. Additionally, the active operation signal ACTD, which is activated after the first delay time passes from a moment when the implicit signal IMPRE is activated, may be a signal for an active operation that is performed after the implicit precharge operation. The first delay time between the output of the implicit signal IMPRE and the output of the active operation signal ACTD is one AC parameter representing operation characteristics of the semiconductor memory device, and it may represent a row precharge time tRP that ranges from a moment when a precharge operation of one bank is completed to a moment when the next active operation begins.

In addition, the bank operation control unit 140 may receive a setup signal TRP<0:4>. The setup signal TRP<0:4> may set up the first delay time, that is, the row precharge time tRP. The active operation signal ACTD may be activated when the first delay time passes after the implicit signal IMPRE is activated. The bank operation control unit 140 may receive the first bank address LARA<15:18> and the first row address TLA<0:14> from the interface unit 110. The bank operation control unit 140 may receive the first bank address LARA<15:18> and then after the first delay time passes, the bank operation control unit 140 may output the second bank address ILARA<15:18> to the bank address decoder 130. The bank operation control unit 140 may receive the first row address TLA<0:14> and then after the first delay time passes, the bank operation control unit 140 may output a second row address ITLA<0:14> to the row address latch unit 170. The second bank address ILARA<15:18> and the second row address ITLA<0:14> may be the same as the first bank address LARA<15:18> and the first row address TLA<0:14>, but they are outputted at a moment delayed by the first delay time.

That is, when the first active signal ACT outputted from the command decoder 120 is a signal for a normal active operation, the bank address decoder 130 may output the bank selection signal BAI<0:15> based on the first bank address LARA<15:18> outputted from the interface unit 110. When the first active signal ACT outputted from the command decoder 120 is a signal for an active operation performed after an implicit precharge operation based on the implicit signal IMPRE, the bank address decoder 130 may output the bank selection signal BAI<0:15> based on the second bank address ILARA<15:18> outputted from the bank operation control unit 140.

Subsequently, the internal precharge signal generation unit 150 may output an internal precharge signal INT_PRE in response to the implicit signal IMPRE. The internal precharge signal generation unit 150 may also output the internal precharge signal INT_PRE in response to the precharge signal PCG outputted from the command decoder 120. The internal precharge signal generation unit 150 may receive the precharge signal PCG outputted from the command decoder 120, the implicit signal IMPRE outputted from the bank operation control unit 140, and the bank selection signal BAI<0:15> outputted from the bank address decoder 130. The internal precharge signal generation unit 150 may receive the implicit signal IMPRE and the bank selection signal BAI<0:15> and generate the internal precharge signal INT_PRE for an implicit precharge operation. Furthermore, the internal precharge signal generation unit 150 may receive the precharge signal PCG and the bank selection signal BAI<0:15> and generate the internal precharge signal INT_PRE for a precharge operation.

The bank activation unit 160 may deactivate an activated bank in response to the internal precharge signal INT_PRE, or activate a deactivated bank in response to the active operation signal ACTD. The bank activation unit 160 may receive the active operation signal ACTD outputted from the bank operation control unit 140, the internal precharge signal INT_PRE outputted from the Internal precharge signal generation unit 150, and the bank selection signal BAI<0:15> outputted from the bank address decoder 130. The bank activation unit 160 may receive the active operation signal ACTD and activate the bank activation signal RACT<0:15>. Also, the bank activation unit 160 may receive the internal precharge signal INT_PRE from the internal precharge signal generation unit 150 and deactivate the bank activation signal RACT<0:15>.

The row address latch unit 170 may receive the active operation signal ACTD outputted from the bank operation control unit 140, the first row address TLA<0:14> outputted from the interface unit 110, and the second row address ITLA<0:14> outputted from the bank operation control unit 140. The row address latch unit 170 may latch the first row address TLA<0:14> and output a row selection signal ATROW<0:14> or latch the second row address ITLA<0:14> and output the row selection signal ATROW<0:14> in response to the active operation signal ACTD.

Described hereafter is the operation of the semiconductor memory device 1000.

The bank operation control unit 140 may receive the first active signal ACT outputted from the command decoder 120. The bank operation control unit 140 may output the implicit signal IMPRE or the active operation signal ACTD based on the bank activation signal RACT<0:15> and the bank selection signal BAI<0:15>. For example, when a first bank is selected to be activated based on a bank selection signal BAI<0> while a bank activation signal RACT<0> is deactivated, the bank operation control unit 140 may activate the active operation signal ACTD based on the activated first active signal ACT. That is, to perform the normal active operation of the first bank when the bank activation signal RACT<0> is deactivated, the bank operation control unit 140 determines the first active signal ACT as a command signal for a normal active operation and thus activates the active operation signal ACTD. The bank activation unit 160 and the row address latch unit 170 may receive the active operation signal ACTD. The bank activation unit 160 may activate the bank activation signal RACT<0> for the first bank to perform a normal active operation based on the activated active operation signal ACTD. The row address latch unit 170 may latch the first row address TLA<0:14> outputted from the interface unit 110 and output the row selection signal ATROW<0:14> based on the activated active operation signal ACTD. Therefore, in a bank which receives the row selection signal ATROW<0:14> outputted from the row address latch unit 170 and the bank activation signal RACT<0> outputted from the bank activation unit 160, a particular word line corresponding to the row selection signal ATROW<0:14> may be activated.

When a second bank is selected to be activated based on a bank selection signal BAI<1> while a bank activation signal RACT<1> is activated, the bank operation control unit 140 may activate the implicit signal IMPRE based on the activated first active signal ACT. That is, since the bank activation signal RACT<1> is activated, the first active signal ACT is determined to be a command signal for performing an implicit precharge operation and thus the implicit signal IMPRE is activated to perform an implicit precharge operation. The implicit signal IMPRE may be transmitted to the internal precharge signal generation unit 150. The internal precharge signal generation unit 150 may activate the internal precharge signal INT_PRE for the implicit precharge operation on the second bank that is selected based on the bank selection signal BAI<1>. The bank activation unit 160 may receive the internal precharge signal INT_PRE and output the deactivated bank activation signal RACT<1>, and the second bank may perform a precharge operation. Subsequently, the bank operation control unit 140 may activate the active operation signal ACTD after the first delay time passes from the moment when the implicit signal IMPRE is activated. Additionally, the bank operation control unit 140 may output the second bank address ILARA<15:18> and the second row address ITLA<0:14> when the active operation signal ACTD is activated. The bank activation unit 160 and the row address latch unit 170 may receive the active operation signal ACTD. The bank activation unit 160 may receive the active operation signal ACTD and activate the bank activation signal RACT<1>. The row address latch unit 170 latches the second row address ITLA<0:14> outputted from the bank operation control unit 140 and outputs the row selection signal ATROW<0:14> based on the activated active operation signal ACTD. Therefore, the second bank that receives the bank activation signal RACT<1> and the row selection signal ATROW<0:14> may activate a particular word line corresponding to the row selection signal ATROW<0:14>.

When the first active signal ACT is received, the semiconductor memory device 1000 may generate the active operation signal ACTD for an active operation of the bank corresponding to the bank selection signal BAI<0:15> or the implicit signal IMPRE for the implicit precharge operation based on the bank selection signal BAI<0:15> and the bank activation signal RACT<0:15>. When the bank corresponding to the bank selection signal BAI<0:15> is currently activated, the semiconductor memory device 1000 generates the implicit signal IMPRE and performs an implicit precharge operation on the bank. The semiconductor memory device 1000 may activate the active operation signal ACTD after the first delay time passes and perform the active operation on the bank. The semiconductor memory device 1000 may receive the active command, which is the first active signal ACT, perform the precharge operation based on the implicit signal IMPRE, and after the first delay time passes, perform the active operation. When activating another word line for the bank that is in an activated state currently, the semiconductor memory device 1000 may perform both a precharge operation and an active operation based on one active command. Generally, a semiconductor memory device needs a precharge command and an active command to perform a precharge operation and an active operation. Therefore, the semiconductor memory device 1000 may perform a data access operation smoothly with a limited bandwidth for commands.

Figure 2:
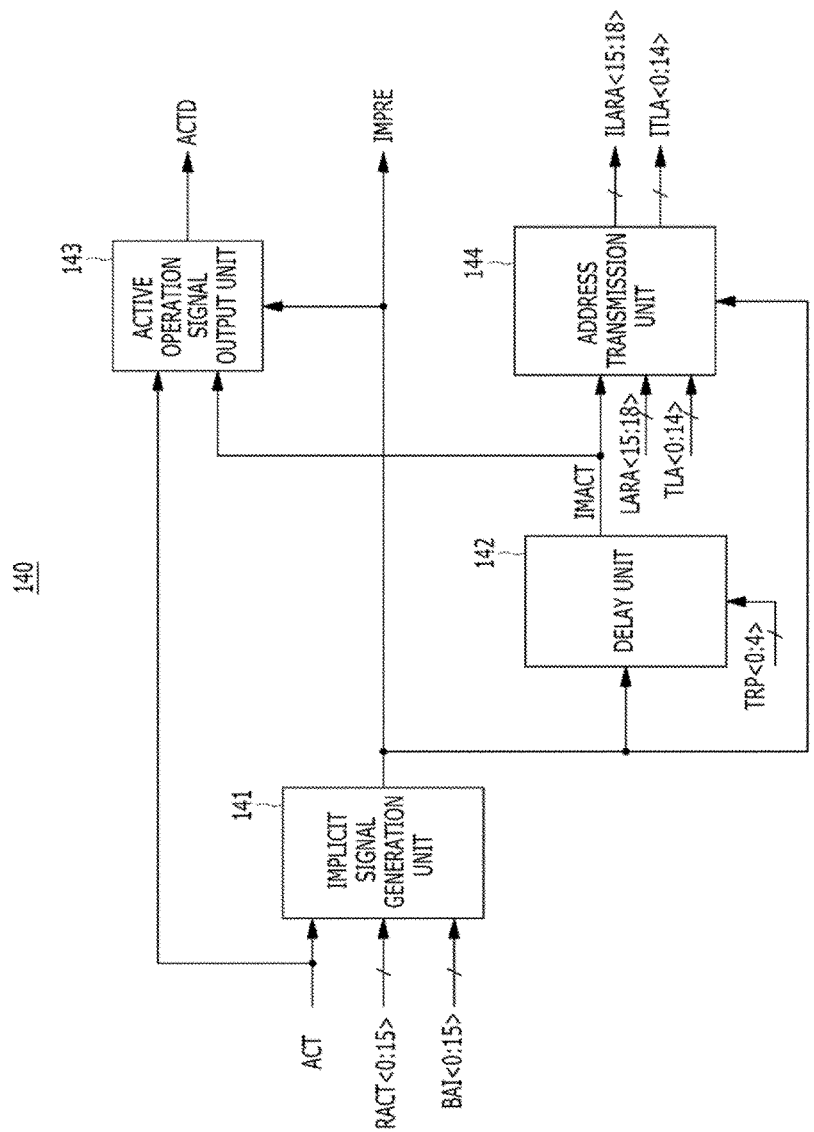
FIG. 2 is a detailed diagram of a bank operation controller shown in FIG. 1.

FIG. 2 is a detailed diagram of the bank operation control unit 140 shown in FIG. 1.

Referring to FIG. 2, the bank operation control unit 140 may include an implicit signal generation unit 141, a delay unit 142, an active operation signal output unit 143, and an address transmission unit 144.

The implicit signal generation unit 141 may receive the bank selection signal BAI<0:15>, the bank activation signal RACT<0:15>, and the first active signal ACT. The implicit signal generation unit 141 may generate the implicit signal IMPRE based on the bank selection signal BAI<0:15>, the bank activation signal RACT<0:15>, and the first active signal ACT. The implicit signal generation unit 141 may receive the bank selection signal BAI<0:15> and the bank activation signal RACT<0:15>. The implicit signal generation unit 141 may receive the first active signal ACT, and if the bank activation signal RACT<0:15> of the bank corresponding to the bank selection signal BAI<0:15> is activated, it may activate the implicit signal IMPRE. Thus, when the bank activation signal RACT<0:15> of the bank selected based on the bank selection signal BAI<0:15> is activated and the first active signal ACT is received, the implicit signal generation unit 141 may activate the implicit signal IMPRE. The activating of the bank activation signal RACT<0:15> of the bank corresponding to the bank selection signal BAI<0:15> means that the bank has already performed the active operation, and the receiving of the first active signal ACT means that an active operation needs to be performed after the precharge operation is performed on the bank. Furthermore, when the bank activation signal RACT<0:15> corresponding to the bank selected based on the bank selection signal BAI<0:15> is deactivated and the first active signal ACT is received, the implicit signal IMPRE may be deactivated. The deactivating of the bank activation signal RACT<0:15> of the bank corresponding to the bank selection signal BAI<0:15> means that the bank has not performed an active operation yet, and the receiving of the first active signal ACT means that a normal active operation needs to be performed on the bank.

The delay unit 142 may activate a second active signal IMACT in response to the implicit signal IMPRE after the first delay time passes. The delay unit 142 receives the setup signal TRP<0:4> and the implicit signal IMPRE to generate the second active signal IMACT that is a signal delayed by the first delay time. The delay unit 142 may output the second active signal IMACT to the active operation signal output unit 143 and the address transmission unit 144.

The active operation signal output unit 143 may receive the first active signal ACT, the second active signal IMACT, and the implicit signal IMPRE. The active operation signal output unit 143 may generate the active operation signal ACTD based on the implicit signal IMPRE. When the implicit signal IMPRE is deactivated and the first active signal ACT or the second active signal IMACT is activated, the active operation signal output unit 143 may output the activated active operation signal ACTD. Moreover, when the implicit signal IMPRE is activated, the active operation signal output unit 143 may deactivate the active operation signal ACTD although the first active signal ACT or the second active signal IMACT is activated.

The address transmission unit 144 receives the implicit signal IMPRE and when the implicit signal IMPRE is activated, the address transmission unit 144 may latch the first bank address LARA<15:18> and the first row address TLA<0:14>. Subsequently, the address transmission unit 144 may receive the second active signal IMACT and when the second active signal IMACT is activated, the address transmission unit 144 may output the latched first bank address LARA<15:18> and the latched first row address TLA<0:14> as the second bank address ILARA<15:18> and the second row address ITLA<0:14>, respectively. Thus, the address transmission unit 144 may temporarily store the first bank address LARA<15:18> and the first row address TLA<0:14> that are inputted before the bank performs the precharge operation based on the implicit signal IMPRE. The address transmission unit 144 may output the first bank address LARA<15:18> and the first row address TLA<0:14> as the second bank address ILARA<15:18> and the second row address ITLA<0:14> along with the second active signal IMACT.

Figure 3:
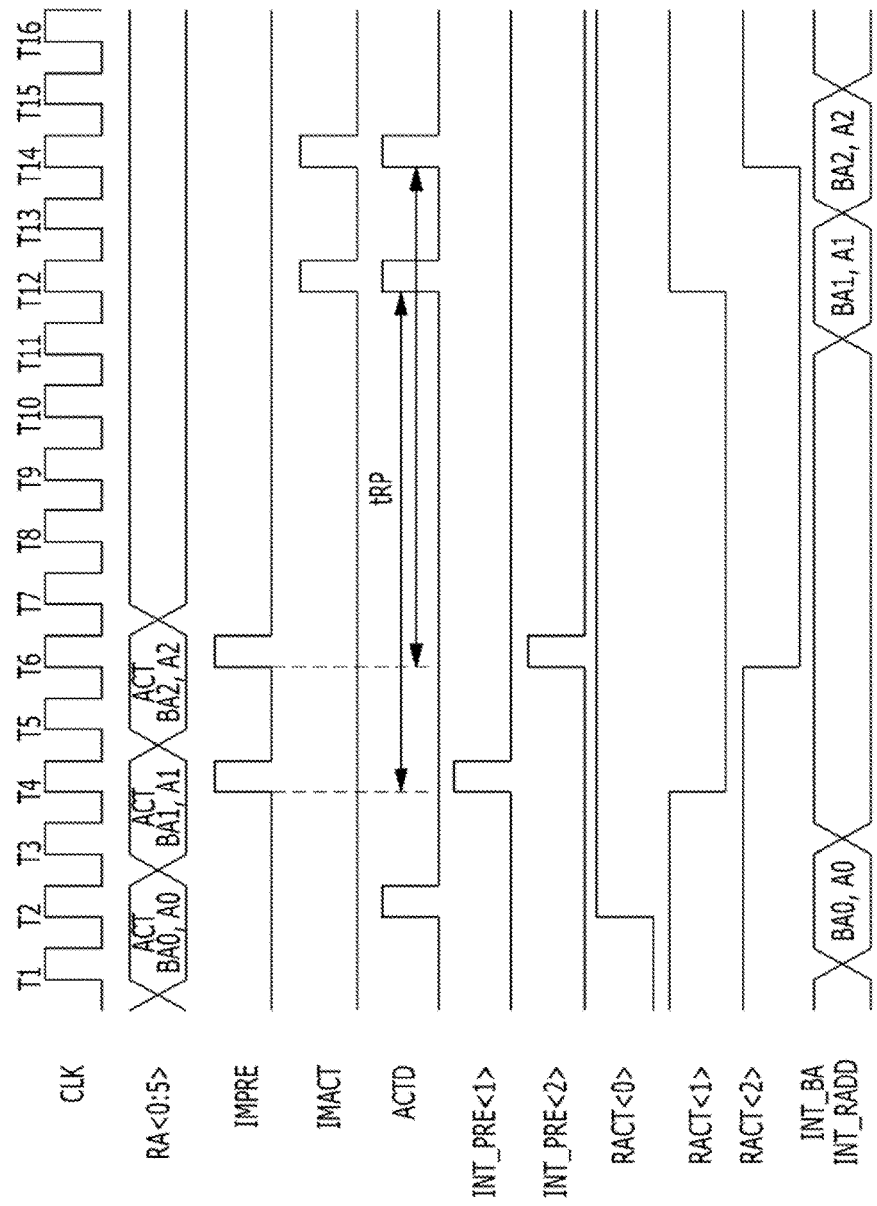
FIG. 3 is a timing diagram for describing an operation of the semiconductor memory device shown in FIGS. 1 and 2.

FIG. 3 is a timing diagram for describing an operation of the semiconductor memory device shown in FIGS. 1 and 2.

Referring to FIG. 3, the external address RA<0:5> may be inputted in synchronization with the clock signal CLK. At a T1 moment, a first active signal ACT with a bank address BA0 and a row address A0 may be inputted. At a T3 moment, a first active signal ACT with a bank address BA1 and a row address A1 may be inputted. At a T5 moment, a first active signal ACT with a bank address BA2 and a row address A2 may be inputted.

The first active signal ACT received at the T1 moment may be a signal for a normal active operation since the bank activation signal RACT<0> corresponding to the first bank is in a logic low level at the T1 moment. Therefore, the active operation signal ACTD is activated and the bank activation signal RACT<0> may be activated to a logic high level. The bank activation unit 160 may receive the bank address of BA0, and the row address latch unit 170 may receive the row address of A0. A word line corresponding to the row address A0 of the first bank performs an active operation based on the activated bank activation signal RACT<0>.

An internal bank address INT_BA and a row address INT_RADD shown in FIG. 3 respectively represent the bank address for generating the bank selection signal shown in FIG. 1, and the row address for the row address latch unit 170 that generates the row selection signal.

The first active signal ACT received at the T3 moment may signify that the bank is already in an activated state since the bank activation signal RACT<1> corresponding to the second bank is in a logic high level at the T3 moment. Therefore, the bank operation control unit 140 may activate the implicit signal IMPRE for an implicit precharge operation. The internal precharge signal generation unit activates an internal precharge signal INT_PRE<1> based on the activated implicit signal IMPRE. The bank activation unit 160 may generate the bank activation signal RACT<1> having a logic low level based on the activated internal precharge signal INT_PRE<1>. Subsequently, the bank operation control unit 140 may generate the second active signal IMACT at a T12 moment after the first delay time passes and generate the activated active operation signal ACTD. The bank activation unit 160 may output the bank activation signal RACT<1> that is activated to a logic high level based on the active operation signal ACTD that is activated at the T12 moment. At a T4 moment when the implicit signal IMPRE is activated, the address transmission unit may latch the bank address BA1 and a row address of A1. At the T12 moment when the second active signal IMACT is activated, the bank activation unit 160 receives the latched bank address BA1, and the row address latch unit 170 receives the latched row address of A1. The word line corresponding to the row address of A1 of the second bank performs an active operation based on the activated bank activation signal RACT<1>.

Likewise, the first active signal ACT received at the T5 moment may signify that the bank is already in an activated state since the bank activation signal RACT<2> corresponding to a third bank is in a logic high level at the T5 moment. Therefore, the implicit signal IMPRE is activated at a T6 moment. The internal precharge signal generation unit activates an internal precharge signal INT_PRE<2> based on the implicit signal IMPRE activated at the T6 moment. The bank activation unit 160 may generate the bank activation signal RACT<2> having a logic low level based on the activated internal precharge signal INT_PRE<2>. Subsequently, the bank operation control unit 140 may generate the second active signal IMACT at a T14 moment after the first delay time passes and generate the activated active operation signal ACTD. The bank activation unit 160 may output the bank activation signal RACT<2> that is activated to a logic high level based on the active operation signal ACTD that is activated at the T14 moment. At the T4 moment when the implicit signal IMPRE is activated, the address transmission unit may latch the bank address BA2 and a row address A2. At the T14 moment when the second active signal IMACT is activated, the bank activation unit 160 receives the latched bank address BA2 and the row address latch unit 170 receives the latched row address A2. The word line corresponding to the row address A2 of the third bank performs an active operation based on the activated bank activation signal RACT<2>.

Figure 4:
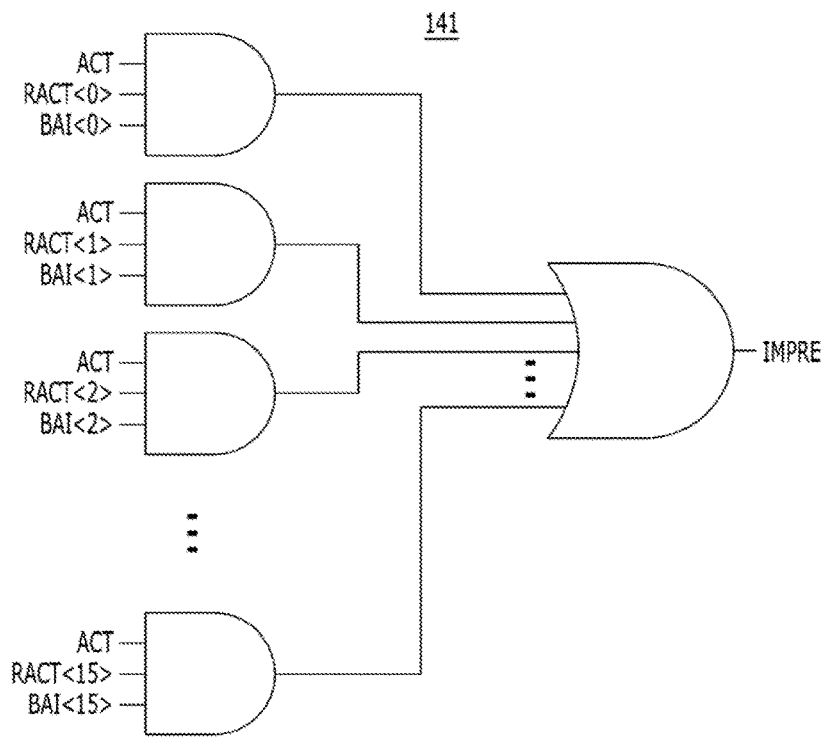
FIG. 4 is a detailed diagram of an implicit signal generation unit shown in FIG. 2.

FIG. 4 is a detailed diagram of the implicit signal generation unit 141 shown in FIG. 2.

Referring to FIG. 4, the implicit signal generation unit 141 may be formed of a plurality of logic gates. The implicit signal generation unit 141 may include AND gates for receiving the first active signal ACT, the bank selection signal BAI<0:15>, and the bank activation signal RACT<0:15>, respectively. Additionally, the implicit signal generation unit 141 may include an OR gate for receiving the output signals of the AND gates as its input signals. For example, when the bank selection signal BAI<0:15> for selecting the first bank is activated and the first bank is in an activated state, the bank activation signal RACT<0> is activated. If the first active signal ACT is received, the OR gate receives an output signal having a logic high level. As a result, the implicit signal IMPRE is activated to a logic high level. Furthermore, when the bank selection signal BAI<1> for selecting the second bank is activated and the second bank is not in an activated state, the bank activation signal RACT<1> is deactivated. If the first active signal ACT is received, the OR gate may not receive an output signal having a logic high level. As a result, the implicit signal IMPRE is deactivated to a logic low level.

Figure 5:
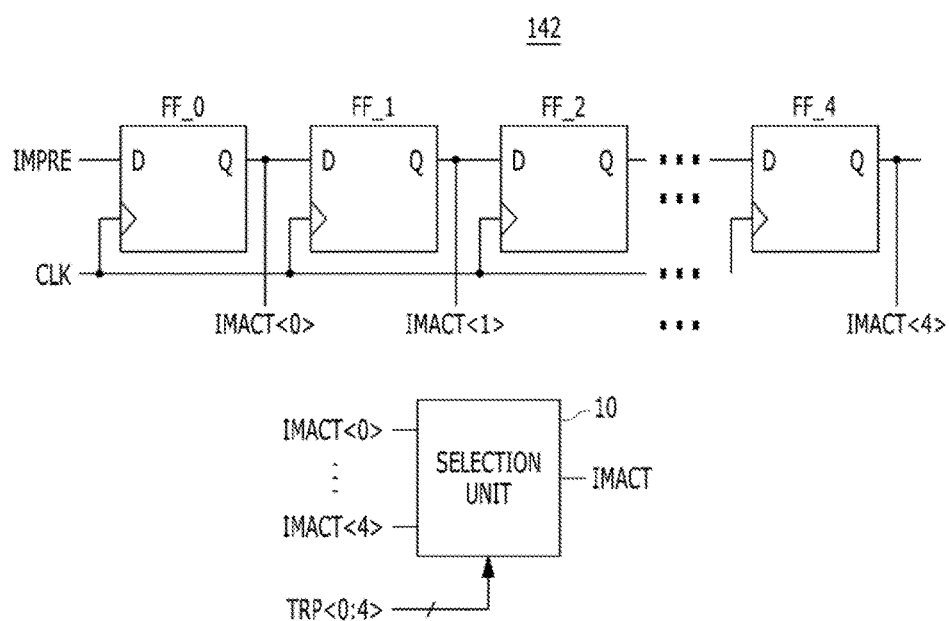
FIG. 5 is a detailed diagram of a delay unit shown in FIG. 2.

FIG. 5 is a detailed diagram of the delay unit 142 shown in FIG. 2.

Referring to FIG. 5, the delay unit 142 may be formed of a shift register circuit including synchronization elements FF<0:4> coupled in series. Each of the synchronization elements FF<0:4> may include a DQ flip-flop. The delay unit 142 delays the implicit signal IMPRE in synchronization with the clock signal CLK. The respective synchronization elements FF<0:4> outputs corresponding signals IMACT<0:4>. A selection unit 10 may receive the signals IMACT<0:4> and output one signal selected based on the setup signal TRP<0:4>, as the second active signal IMACT.

Moreover, the delay unit 142 may be formed of a counting circuit including the synchronization elements FF<0:4>.

Figure 6:
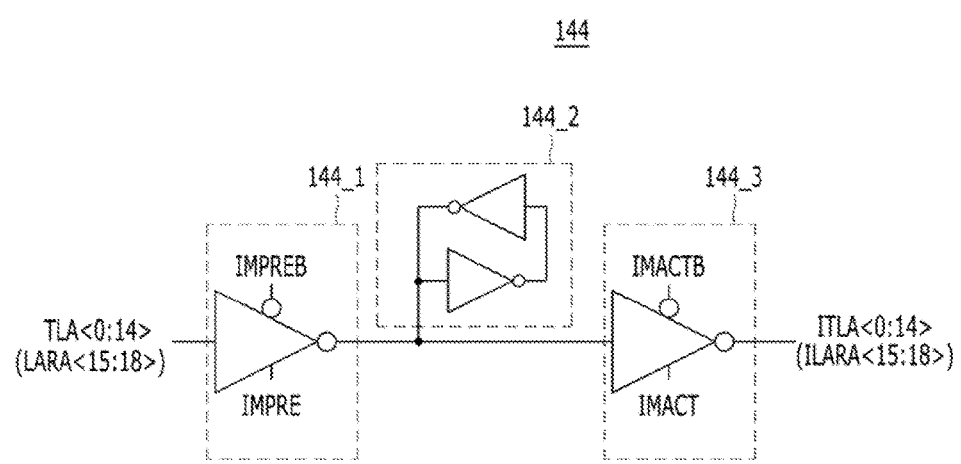
FIG. 6 is a detailed diagram of an address transmission unit shown in FIG. 2.

FIG. 6 is a detailed diagram of the address transmission unit 144 shown in FIG. 2.

Referring to FIG. 6, the address transmission unit 144 may be formed of a one-step pipe circuit. The address transmission unit 144 may include a first inverter unit 144_1, a latch unit 144_2, and a second inverter unit 144_3.

The address transmission unit 144 receives the first bank address LARA<15:18> or the first row address TLA<0:14>. The first inverter unit 144_1 may invert the first bank address LARA<15:18> or the first row address TLA<0:14> based on the implicit signal IMPRE, and output the inverted signals to the latch unit 144_2. The latch unit 144_2 may latch the first bank address LARA<15:18> or the first row address TLA<0:14>, inverted by the first inverter unit 144_1. The second inverter unit 144_3 may invert the latched first bank address LARA<15:18> or the first row address TLA<0:14>, inverted by the first inverter unit 144_1 in response to the second active signal IMACT, and output the second bank address ILARA<15:18> or the second row address ITLA<0:14>. Although the address transmission unit 144 is described to be formed as a one-step pipe circuit, it may be formed as a multi-step pipe circuit to perform a first in first out (FIFO) operation on the first bank address LARA<15:18> or the first row address TLA<0:14>.

According to the embodiment of the present invention, the semiconductor memory device may smoothly perform a data access operation with limited bandwidth by performing an implicit precharge operation and an active operation based on one active command.

Additionally, the logic gates and transistors described in the above-described embodiments of the present invention may be realized to have different locations and kind according to the polarity of an input signal.

While the present invention has been described with respect to the specific embodiments, it will be apparent to those skilled in the art that various changes and modifications may be made without departing from the spirit and scope of the invention as defined in the following claims.

What is claimed is:
1. A semiconductor memory device, comprising:
a plurality of banks;
a bank operation control unit suitable for receiving a first active signal and bank information, and activating a first active operation signal for an active operation of a selected bank corresponding to the bank information among the plurality of banks when the selected bank is deactivated, or activating an implicit signal for a precharge operation of the selected bank and a second active operation signal for an active operation of the selected bank after a predetermined time passes when the selected bank is activated;
an internal precharge signal generation unit suitable for generating an internal precharge signal based on a precharge signal or the implicit signal; and
a bank activation unit suitable for activating a bank among the plurality of banks based on the first active operation signal, or deactivating a bank among the plurality of banks based on the internal precharge signal, deactivating a bank activation signal based on the internal precharge signal when a precharge operation is performed, then activating the deactivated bank corresponding to the bank information based on the second active operation signal, and activating the bank activation signal based on the first active operation signal and second active operation signal when the precharge operation is not performed.

2. The semiconductor memory device of claim 1, wherein the bank activation signal represents whether or not the selected bank is activated based on the first and second active operation signals or the internal precharge signal.

3. The semiconductor memory device of claim 1, further comprising:
an interface unit suitable for receiving an external address and an external clock signal and outputting a command identification signal, a row address, and a bank address; and
a command decoder suitable for decoding the command identification signal and outputting the first active signal.

4. The semiconductor memory device of claim 2, wherein the bank operation control unit includes:
an implicit signal generation unit suitable for generating the implicit signal based on the bank activation signal of the selected bank;
a delay unit suitable for receiving the implicit signal and activating a second active signal after the predetermined time passes;
an active operation signal output unit suitable for generating an active operation signal for the selected bank based on the first active signal or a second active signal that is obtained by delaying the implicit signal by the predetermined time according to the implicit signal; and
an address transmission unit suitable for temporarily storing the row address and the bank address based on the implicit signal, and outputting the row address and the bank address based on the second active signal.

5. The semiconductor memory device of claim 3, further comprising:
a row address latch unit suitable for latching the row address transmitted from the interface unit or the address transmission unit based on the active operation signal; and
a bank address decoder suitable for decoding the bank address transmitted from the interface unit or the address transmission unit, and generating a bank selection signal.

6. The semiconductor memory device of claim 5, wherein the bank information includes the bank selection signal.

7. The semiconductor memory device of claim 5, wherein the predetermined time corresponds to a row precharge time.

8. A semiconductor memory device, comprising:
a plurality of banks;
a bank operation control unit suitable for receiving a first active signal and bank information, and activating a first active operation signal based on the first active signal and the bank information when the selected bank is deactivated, or activating an implicit signal for a precharge operation of a selected bank corresponding to the bank information among the plurality of banks based on the first active signal and the bank information and then activating a second active operation signal after a predetermined time passes when the selected bank is activated, based whether or not the selected bank is activated before the first active signal and the bank information are received;
an internal precharge signal generation unit suitable for generating an internal precharge signal based on a precharge signal or the implicit signal; and
a bank activation unit suitable for activating a bank activation signal based on the first active operation signal or the second active operation signal corresponding to the bank information when a precharge operation is not performed, and deactivating the bank activation signal based on the internal precharge signal when the precharge operation is performed.

9. The semiconductor memory device of claim 8, further comprising:
an interface unit suitable for receiving an external address and an external clock signal and outputting a command identification signal, a row address, and a bank address; and
a command decoder suitable for decoding the command identification signal and outputting the first active signal and the precharge signal.

10. The semiconductor memory device of claim 9, wherein the bank operation control unit includes:
an implicit signal generation unit suitable for generating the implicit signal based on the bank activation signal of the selected bank;
a delay unit suitable for receiving the implicit signal and activating the second active signal after the predetermined time passes;
an active operation signal output unit suitable for generating an active operation signal for the bank based on the first active signal or a second active signal that is obtained by delaying the implicit signal by the predetermined time according to the implicit signal; and
an address transmission unit suitable for temporarily storing the row address and the bank address based on the implicit signal, and outputting the row address and the bank address based on the second active signal.

11. The semiconductor memory device of claim 10, further comprising:
a row address latch unit suitable for latching the row address transmitted from the interface unit or the address transmission unit based on the active operation signal; and
a bank address decoder suitable for decoding the bank address transmitted from the interface unit or the address transmission unit and generating a bank selection signal.

12. The semiconductor memory device of claim 8, wherein the predetermined time corresponds to a row precharge time.

* * * * *